United States Patent
Madigan

(10) Patent No.: US 7,541,537 B2
(45) Date of Patent: Jun. 2, 2009

(54) PHOTOVOLTAIC CELL COVER

(76) Inventor: Joe Madigan, 20 Apple Tree La., Alamo, CA (US) 94507

( * ) Notice: Subject to any disclaimer, the term of this patent is extended or adjusted under 35 U.S.C. 154(b) by 0 days.

(21) Appl. No.: 11/768,115

(22) Filed: Jun. 25, 2007

(65) Prior Publication Data
US 2008/0000526 A1 Jan. 3, 2008

Related U.S. Application Data

(60) Provisional application No. 60/821,383, filed on Aug. 3, 2006, provisional application No. 60/813,635, filed on Jul. 3, 2006.

(51) Int. Cl.
*H01L 31/00* (2006.01)
(52) U.S. Cl. .................. 136/247; 136/246; 136/256; 136/257; 136/259
(58) Field of Classification Search .............. 136/257, 136/256, 247, 246, 259
See application file for complete search history.

(56) References Cited

U.S. PATENT DOCUMENTS

| | | | | |
|---|---|---|---|---|
| 3,426,212 A | 2/1969 | Klaas | ........................ | 250/226 |
| 3,591,420 A * | 7/1971 | Steed | ........................ | 136/257 |
| 3,935,031 A | 1/1976 | Adler | ........................ | 136/206 |
| 4,088,508 A | 5/1978 | Gravisse | ........................ | 136/89 |
| 4,127,425 A | 11/1978 | Chambers | ........................ | 136/89 |
| 4,149,902 A | 4/1979 | Mauer et al. | ........................ | 136/89 |
| 4,175,980 A | 11/1979 | Davis et al. | ........................ | 136/89 |
| 4,186,033 A * | 1/1980 | Boling et al. | ........................ | 136/247 |
| 4,193,819 A | 3/1980 | Wohlmut | ........................ | 136/89 |
| 4,329,535 A | 5/1982 | Rapp | ........................ | 136/259 |
| 4,367,367 A | 1/1983 | Reisfeld et al. | ........................ | 136/247 |
| 4,629,821 A | 12/1986 | Bronstein-Bonte et al. | .. | 136/257 |
| 4,661,649 A | 4/1987 | Reisfeld et al. | ........................ | 136/247 |
| 5,431,742 A | 7/1995 | Kleinerman | ........................ | 136/247 |
| 5,449,413 A | 9/1995 | Beauchamp et al. | ........................ | 136/257 |
| 6,538,191 B1 * | 3/2003 | MacDonald | ........................ | 136/247 |

FOREIGN PATENT DOCUMENTS

DE 10329917 * 2/2005

OTHER PUBLICATIONS

Weber, W. H., et al. "Luminescent Greenhouse Collector for Solar Radiation", Applied Optics, vol. 15, No. 1, Oct. 1976, pp. 2299-2300.*
Paper SPIE 2121-09, *Laser Power Beaming*, SPIE Proceedings vol. 2121, pp. 58-65 (1994), Landis, Geoffrey A., Prospects for Solar Pumped Semiconductor Lasers, (pp. 1-11).
International Search Report—Jul. 29, 2008 (3 pages).

* cited by examiner

*Primary Examiner*—Alex Noguerola
*Assistant Examiner*—J. Christopher Ball
(74) *Attorney, Agent, or Firm*—Steven R. Vosen

(57) ABSTRACT

The present invention is a photovoltaic cell having improved conversion properties. The cell includes a cover for a photovoltaic device. In one embodiment, the cover includes a fluorescent material that shifts the wavelength of some of the incident light to be closer to the wavelength that produces the least amount of thermal loading on the photovoltaic device. In another embodiment, the cover includes a fluorescent material between two reflective filters. The cell and cover may either be placed together in a stack or separated from one another.

26 Claims, 6 Drawing Sheets

PHOTOVOLTAIC CELL COVER

CROSS-REFERENCE TO RELATED APPLICATIONS

This application claims the benefit of U.S. Provisional Application No. 60/813,635 filed Jul. 3, 2006, and U.S. Provisional Application No. 60/821,383 filed Aug. 3, 2006. The entire contents of the above-listed provisional application are hereby incorporated by reference herein and made part of this specification.

BACKGROUND OF THE INVENTION

1. Field

The present invention generally relates to photovoltaics, and more particularly to a method and system for covering photovoltaic cells.

2. Discussion of Related Art

The efficiency with which a solar-to-electricity power conversion device can convert sunlight into electricity is determined, in part, by how well the device responds to the spectral characteristics of the solar flux. Photovoltaic devices, for example, are capable of absorbing light, at varying efficiency, over a large part of the solar spectrum. While some of the solar photons are efficiently converted to electricity, other photons impart only some of their energy to electric energy, and others simply heat the photovoltaic device.

Photovoltaic devices are capable of converting only a fraction of solar photons into electricity. Thus, for example, silicon photovoltaic cells can convert light from approximately 0.3 μm to approximately 1.1 μm into electron-hole pairs, which may be used to generate electricity. Photons having longer wavelengths have an energy that is less than the band gap energy of silicon photovoltaic cells, and are not absorbed. Photons having a wavelength below the upper limit but that are not converted to electricity are converted to heat, which raises the temperature of the photovoltaic device. In addition, some of the energy of photovoltaically converted photons also appears as heat. Specifically, the difference between the photon energy and the band gap energy is not useful for generating electron-hole pairs and is lost as heat within the photovoltaic device.

There are thus many mechanisms affecting photovoltaic conversion and unwanted heating of photovoltaic devices. There is a need in the art for a photovoltaic device that more efficiently converts the solar flux into useable electricity. There is also a need in the art for a photovoltaic device minimizes the amount of heat generated therein. Such a device should be simple and inexpensive, and compatible with current photovoltaic technology.

BRIEF SUMMARY OF THE INVENTION

The present invention overcomes the disadvantages of prior art by converting the spectral characteristics of the solar flux to a spectra that better matches the conversion capabilities of a photovoltaic cell.

In one embodiment, the present invention provides a photovoltaic cell and cover for converting incident radiative flux into electricity including a photovoltaic portion having band gap wavelength and a cell cover substantially covering a light-receiving surface of the photovoltaic portion. The cell cover includes a first layer including a reflective filter and adapted to receive the incident radiative flux, a second layer facing the first layer and including a fluorescent material having pump wavelengths and emission wavelengths, and a third layer between the second layer and the photovoltaic portion, and including a reflective filter. In one embodiment, the first layer and third layer are interference filters. In another embodiment, the first layer and third layer are deposited on opposing sides of the second layer. In yet another embodiment, the second layer includes neodymium. In one embodiment, the first layer transmits light at said pump wavelength and reflects light at said pump wavelength. In one embodiment, the third layer reflects light at said pump wavelength. It is preferred that the emission wavelength is less than or equal to said band gap wavelength.

In another embodiment, a cover for receiving an incident radiative flux for a photovoltaic device is provided, where the photovoltaic device has a band gap wavelength and a light-receiving surface for converting incident radiative flux into electricity. The cell cover includes a first layer including a reflective filter and adapted to receive the incident radiative flux, a second layer facing the first layer and including a fluorescent material having pump wavelengths and emission wavelengths, and a third layer between the second layer and the photovoltaic portion, and including a reflective filter. In one embodiment, the first layer and third layer are interference filters. In another embodiment, the first layer and third layer are deposited on opposing sides of the second layer. In yet another embodiment, the second layer includes neodymium. In one embodiment, the first layer transmits light at said pump wavelength and reflects light at said pump wavelength. In one embodiment, the third layer reflects light at said pump wavelength. It is preferred that the emission wavelength is less than or equal to said band gap wavelength.

These features together with the various ancillary provisions and features which will become apparent to those skilled in the art from the following detailed description, are attained by the photovoltaic cell cover of the present invention, embodiments thereof being shown with reference to the accompanying drawings, by way of example only, wherein:

Reference symbols are used in the Figures to indicate certain components, aspects or features shown therein, with reference symbols common to more than one Figure indicating like components, aspects or features shown therein.

DETAILED DESCRIPTION OF THE PREFERRED EMBODIMENTS

Figure 1A:
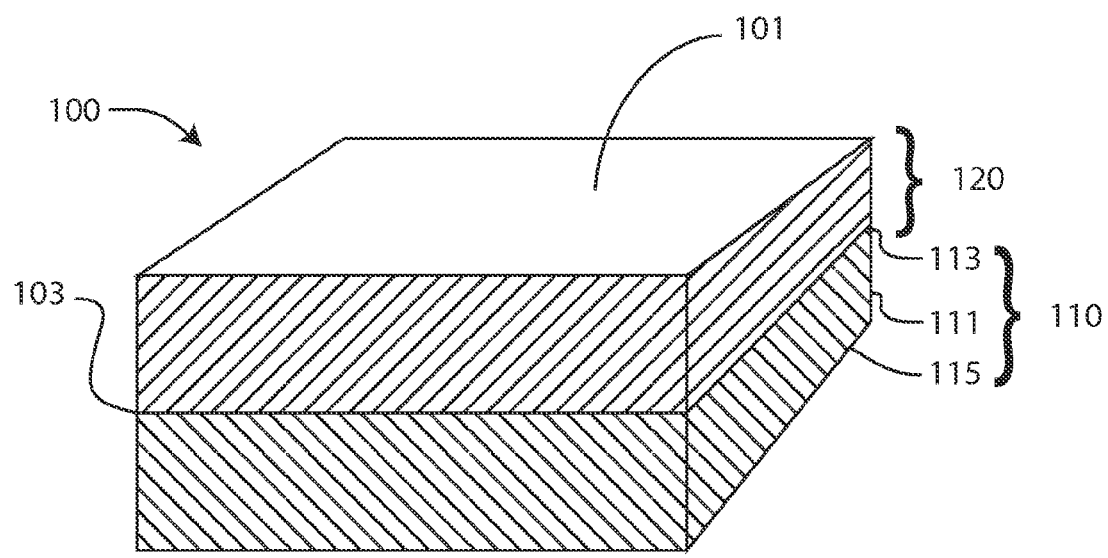
FIG. 1A is a perspective sectional view of a first embodiment photovoltaic cell and cover.

FIG. 1A is a perspective sectional view of a first embodiment photovoltaic cell and cover 100. As shown in FIG. 1A, photovoltaic cell and cover 100 includes a photovoltaic portion 110 and a cell cover 120. Photovoltaic portion 110 includes a photovoltaic material 111 having a front surface 113 and an opposing back surface 115. Cell cover 120 substantially covers the photovoltaic portion front surface 113, and extends from a surface 103 adjacent to photovoltaic portion front surface 113 to a surface 101. In one embodiment, surfaces 101, 103, and 113 are sufficiently planar and parallel to permit light to pass through surface 101 and into photovoltaic portion 110.

Photovoltaic portion 110 includes, in general, a photovoltaic material 111 that is, but is not limited to: a bulk material including, but not limited to, silicon, germanium, or another bulk semiconducting material formed as a monocrystalline, poly- or multicrystalline, or ribbon structure; thin films including, but not limited to, multi-layered thin-film composites, chalcogenide films of Cu(InxGa1–x)(SexS1–x)2, cadmium telluride, conductive polymers, polymer (or organic) solar cells, gallium arsenide (GaAs), dye-sensitized solar cells, silicon thin-films, including but not limited to, amorphous silicon, photocrystalline silicon or nanocrystalline silicon; or quantum dots.

Cell cover 120 extends from a surface 103 adjacent to photovoltaic portion front surface 113 to a surface 101. Cell cover 120 includes one or more optical materials that transmit, interact and modify spectra of light that passes into the cover and into photovoltaic portion 110. Cell cover 120 may be formed on photovoltaic portion 110, as by a semiconductor manufacturing process, such as deposition, may be fixed to the photovoltaic portion, such as with an adhesive, or may be a structure that is separate from and may be placed or held adjacent to or in contact with the photovoltaic portion. In an alternative embodiment, cell cover 120 includes elements that providing spacing between different optical materials or between the optical materials and photovoltaic portion 110.

Figure 1B:
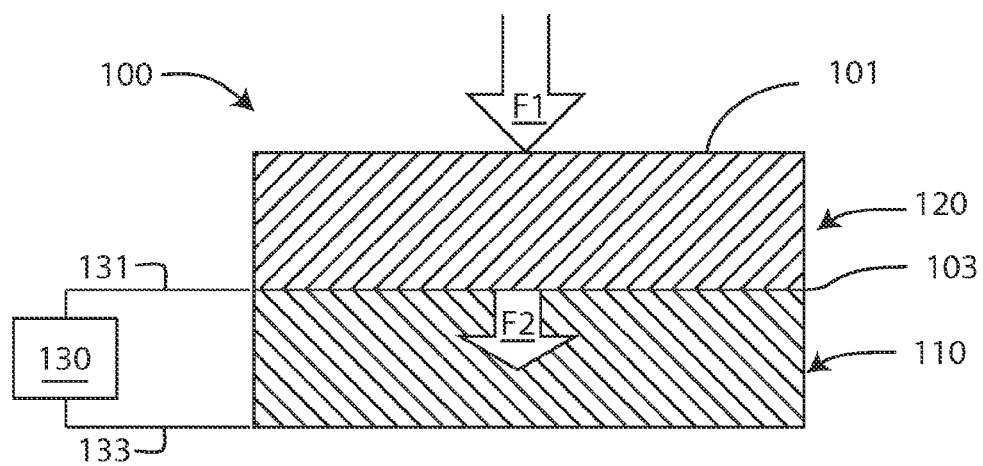
FIG. 1B is a side sectional view of the embodiment of FIG. 1A.
Figure 2:
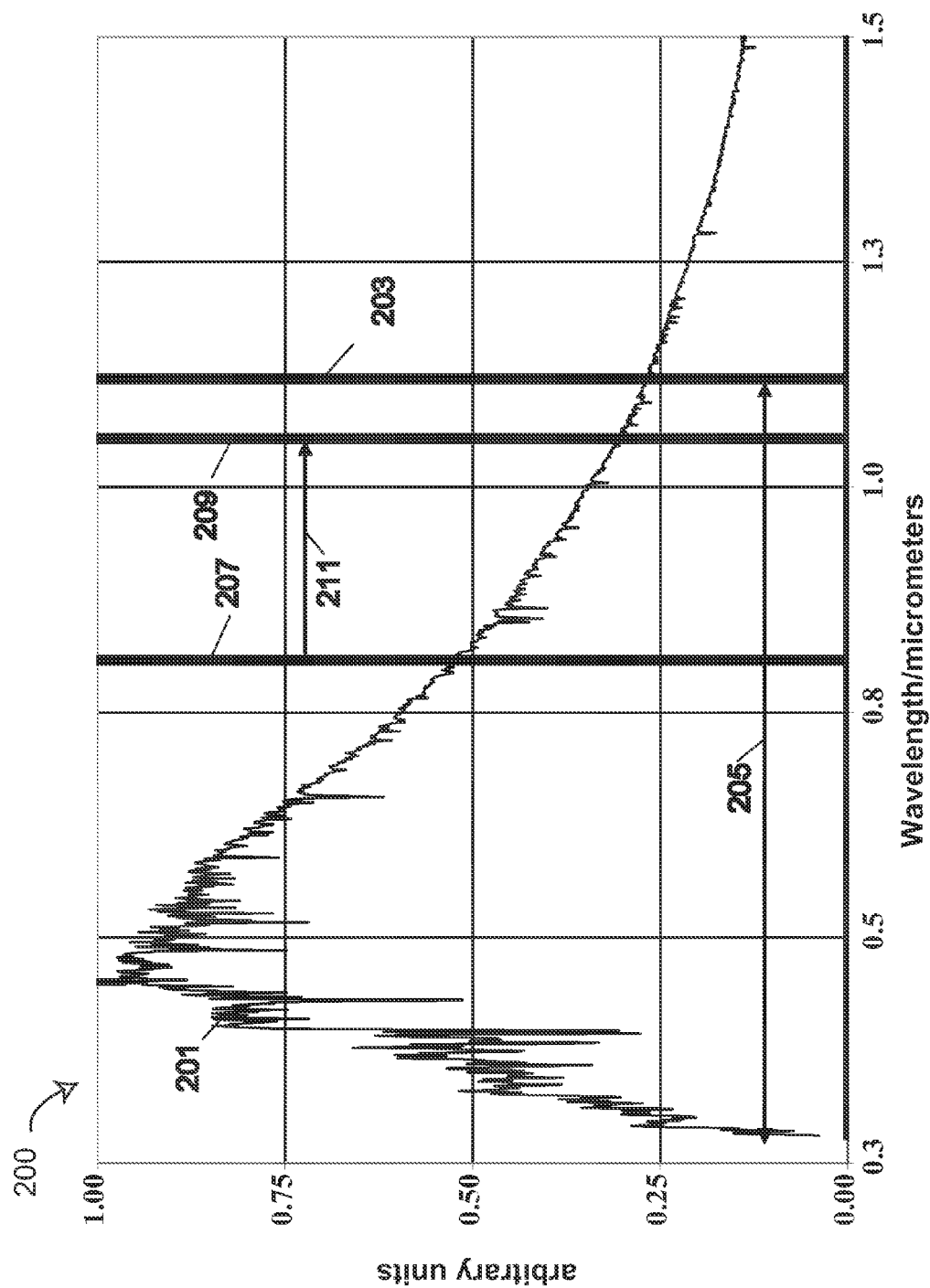
FIG. 2 is graph illustrating the spectral characteristics of one embodiment of a photovoltaic cell.

The operation of photovoltaic cell and cover 100 is illustrated with reference to FIG. 1B, which shows a side sectional view of the photovoltaic cell and FIG. 2 which includes graph 200 illustrating the spectral characteristics of one embodiment of the photovoltaic cell. FIG. 1B also shows, for illustrative purposes, an incident for receiving a radiant flux F1, which may be a solar flux, and a pair of electrical leads 131 and 133 connection photovoltaic portion 110 to an electric load 130. Graph 200 shows a representative solar spectrum 201 (more specifically, the radiant spectral flux density) at the earth's surface over the wavelength range of 0.3 μm to 1.5 μm.

Graph 200 shows characteristics of photovoltaic portion 110, as follows. One way of specifying a photovoltaic material is by the material's band gap energy. Photons having an energy greater than the band gap energy may be absorbed by a photovoltaic material and generate electron-hole pairs useful for producing electric power. The wavelength corresponding to a band gap energy is referred to herein, and without limitation, as the "band gap wavelength." Graph 200 has a line 203 representing the band gap wavelength of photovoltaic material 111. For illustrative purposes which are not meant to limit the scope of the present invention, line 203 is at a wavelength of 1.12 μm, which corresponds to that of a silicon photovoltaic device. Graph 200 also shows a range 205, which extends to from small wavelength up to the band gap wavelength. Photons within range wavelength 205 have energies greater than the band gap energy and thus are absorbed by photovoltaic material 111.

Graph 200 also shows characteristics of cell cover 120, as follows. Cell cover 120 includes a fluorescent material, as described subsequently in greater detail, that absorbs light at or near a first wavelength or range, indicated by a line 207 on graph 200, and emits light at a longer wavelength or range of wavelengths, indicated by a line 209 on the graph. The shift in wavelength between an absorbed photon and a emitted photon is indicated by arrow 211. In the present invention, the materials of cell cover 120 are selected to shift light within range 205 to a wavelength closer to, or in an alternative embodiment, equal to, the band gap wavelength 203 of photovoltaic material 111.

In general, cell cover 120 accepts radiant flux F1 into front surface 101 includes materials that transmit a spectrally altered radiant flux F2 away from the cell cover and through back surface 103 into photovoltaic portion 110. The shift is preferably towards a wavelength which is close to or slightly less than the wavelength corresponding to the band gap of photovoltaic material 111. In one embodiment, the wavelength is shifted to within 10% of the band gap wavelength. In another embodiment, the wavelength is shifted to within 5% of the band gap wavelength.

Only a fraction of the photons within the wavelength range 205 produce electron-hole pairs in photovoltaic material 111. Further, only a fraction of energy of the photons that produce electron-hole pairs becomes useful electrical energy. The energy of the absorbed photons that do not produce electron-hole pairs, and the energy in excess of the band gap energy of photons that do produce electron-hole pairs generate heat in photovoltaic material 111. By shifting the wavelength of light impinging photovoltaic material 111 closer to the band gap wavelength of the photovoltaic material, less heat is generated within the photovoltaic material.

Figure 3:
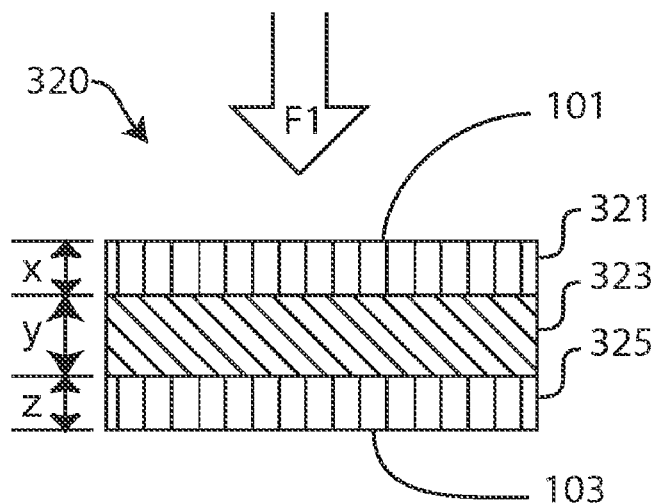
FIG. 3 is a sectional view of a second embodiment cover for a photovoltaic cell.

FIG. 3 depicts a second embodiment cell cover 320, which may be generally similar to cell cover 120, except as further detailed below. Where possible, similar elements are identified with identical reference numerals in the depiction of the embodiments of FIGS. 1A, 1B, and 2.

Cell cover 320 comprises three adjacent layers of optical material: a first layer 321 which includes surface 101, a second layer 323, and a third layer 325 which includes surface 103. Further, first layer 321 and third layer 325 are reflective filters and second layer 323 is a fluorescent material. In general cover cell 320 materials are selected to shift at least a portion of the radiant flux toward the wavelength corresponding to the band gap energy of photovoltaic portion 111.

In one embodiment, cell cover 320 is a laser-like structure that accepts an incident flux, such as F1 as shifts at least a portion of the incident flux towards but not exceeding the band gap wavelength of photovoltaic material 111. Photovoltaic cell 100 including cell cover 320 will now be described with reference specific materials which are meant to be illustrative and not limiting as to the scope of the invention.

In one specific embodiment, photovoltaic portion 111 is a silicon photovoltaic having a band gap energy of 1.11 eV (corresponding to a wavelength of 1.117 μm). Second layer 323 is a slab of a neodynium:glass laser material. One such material is a potassium-barium-aluminum-phosphate based glass, such as LG-750 Phosphate Laser Glass (Schott Glass Technologies, Inc., Duryea, Pa.), having a thickness y of from approximately 3 mm to approximately 25 mm. In one embodiment, layers 321 and 323 are thin interference filters deposited on opposing sides of second layer 323 having negligible thicknesses. In a second embodiment, one or more of layers 321 and 323 are separate interference filters that are adhesively fixed to second layer 323, or that are held in place with a retaining housing element.

Figure 4:
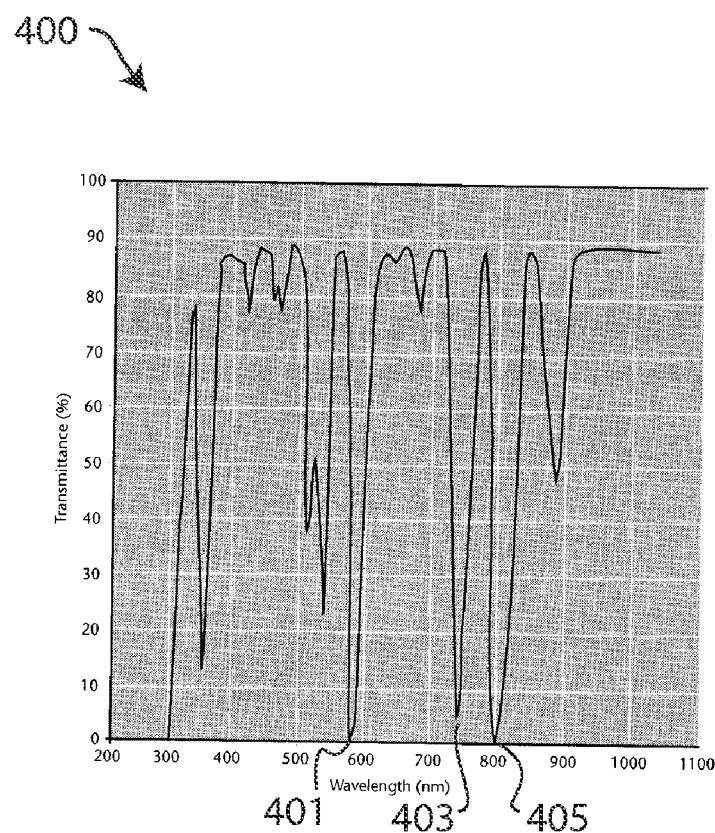
FIG. 4 is a graph illustrating the absorption properties of a material of a first embodiment photovoltaic cell cover.

The optical properties of cell cover 320 are described with reference to FIG. 4, which shows a graph 400 of the transmission curve for LG-750. LG-750 has absorption peaks 401, 403, and 405, in range of approximately 0.6 µm to approximately 0.80 µm at 0.68 µm (peak 401), 0.75 µm (peak 403), and 0.80 µm (peak 405), as well as other absorption features. LG-750 has an emission peak at 1.0537 µm with a width of 0.026 µm.

Layer 321 accepts incident flux, such as a solar flux, and traps light near the absorption features of second layer 323. In one embodiment, first layer 321 is highly transmissive at the absorption wavelengths of second layer 323 and has transmissivity of greater than or equal to 95% at wavelengths from approximately 0.6 µm to approximately 0.80 µm, and is highly reflective, with a reflectivity greater than or equal to 95%, at a wavelength of 1.06 µm. First layer 321 thus accepts solar flux at pumping wavelengths of second layer 323 and reflects any wavelength shifted light back towards photovoltaic portion 110.

In one embodiment, third layer 325 blocks radiant flux that is not effective at generating a current in photovoltaic material 111, and thus, for example is highly reflective for wavelengths less than approximately 0.35 µm. In another embodiment, third layer 325 is highly reflective at a wavelength of 1.06 µm, and thus reflects fluorescence back into second layer 323.

Alternative embodiments for second layer 323 are solid fluorescent materials the shift light to wavelengths less than or equal to the photovoltaic material that is being covered. Examples of such materials include laser materials including, but are not limited to, other neodymium glasses, neodymium YAG, neodymium YLF, neodymium doped YVO4, neodymium doped yttrium calcium oxoborate, titanium sapphire, ytterbium YAG, ytterbium doped glass, and promethium 147 doped phosphate glass. Importantly, second layer 323 should absorb light at wavelengths within the incident radiative flux spectra, and should have emission at or slightly less than the band gap wavelength of the photovoltaic material being pumped.

In general, some or all of the photovoltaic cell and cover or cover layers may include or be a laminated structure, may include substantially planar portions that are bonded or held together, or may include planar portions that are substantially planar and maintained by spacing elements at a spacing with a gap between layers. Two illustrative embodiments having spaced structures are illustrated in FIGS. 5 and 6.

Figure 5:
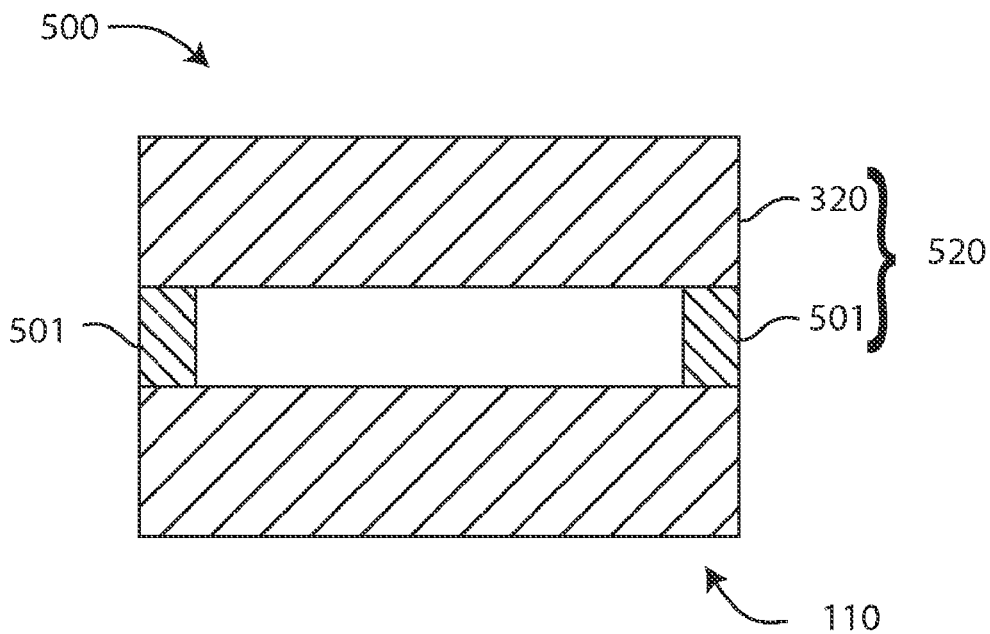
FIG. 5 is a third embodiment of a photovoltaic cell and cover.

FIG. 5 depicts a third embodiment of a photovoltaic cell and cover 500, which may be generally similar to photovoltaic cell and cover 100 except as further detailed. Where possible, similar elements are identified with identical reference numerals in the depiction of the embodiments of FIGS. 1A, 1B, 2, 3, and 4. Photovoltaic cell and cover 500 includes a photovoltaic portion 110 and a cover 520, which includes the optical materials of cell cover 320 and spacing elements 501. Spacing elements 501 are preferably positioned so as to not block active portions of photovoltaic portion 110, are sufficiently thick to keep portion 110 and 320 from touching, and can be formed, as non-limiting examples, from a metal, plastic, or ceramic material. In one embodiment, spacing elements 501 are elements that are separate from portion 110 and cover 320, and that may be adhesively or mechanically fixed, as with screws or other fastening means, to one or both of portion 110 and cover 320. In another embodiment, spacing elements 501 are formed from raised portions of one or both of portion 110 or cover 320.

Figure 6:
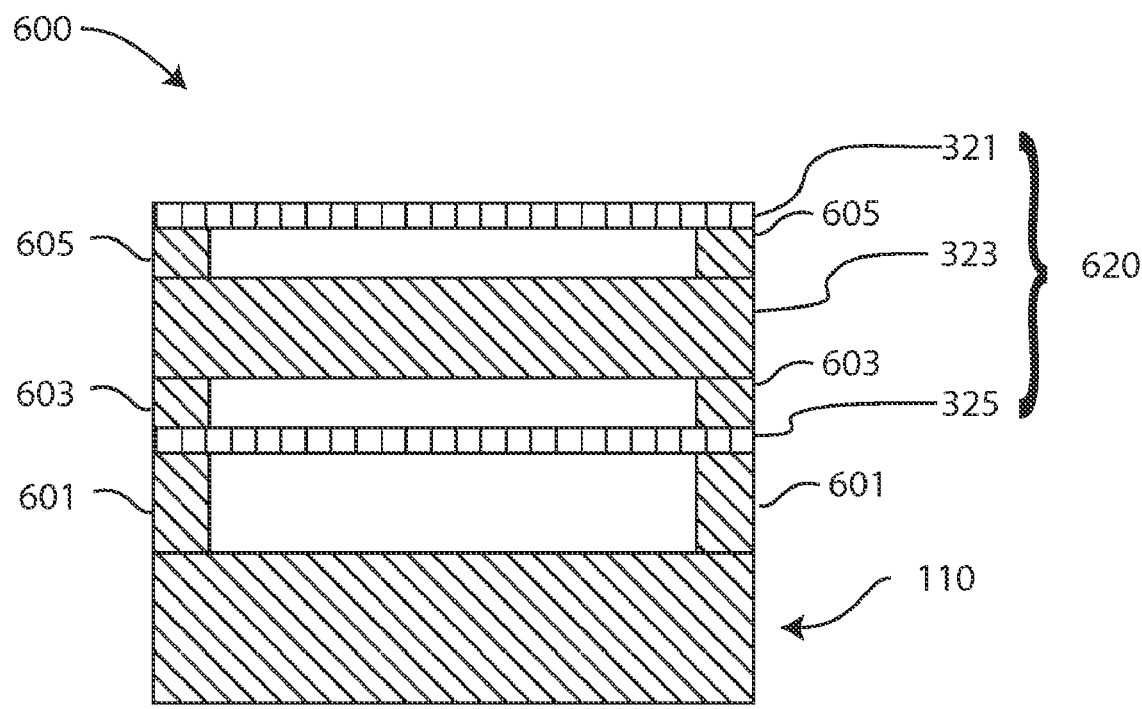
FIG. 6 is a fourth embodiment of a photovoltaic cell and cover.

FIG. 6 depicts a fourth embodiment of a photovoltaic cell and cover 600, which may be generally similar to photovoltaic cell and covers 100 or 500, or cell cover 320, except as further detailed. Where possible, similar elements are identified with identical reference numerals in the depiction of the embodiments of FIGS. 1A, 1B, 2, 3, 4 and 5.

Photovoltaic cell and cover 600 includes a photovoltaic portion 110 and a cell cover 620. Cell cover 620 includes layers 321, 323, and 325 and spacing elements 601, 603, and 605. Spacing elements 601, 603, and 605 are provided to space layers 321, 323, and 325 apart from each other and from photovoltaic portion 110. Spacing elements 601, 603, and 605 are preferably positioned so as to not block active portions of photovoltaic portion 110, are sufficiently thick to keep adjacent ones of portion 110 and layers 321, 323, and 325 from touching, and can be formed, as non-limiting examples, from a metal, plastic, or ceramic material. In one embodiment, one or more of spacing elements 601, 603, and 605 are elements that are separate from portion 110 and layers 321, 323, and 325 and that may be adhesively fixed to one or both of portion 110 and layers 321, 323, and 325. In another embodiment, one or more of spacing elements 601, 603, and 605 are formed from raised portions of one or both of portion 110 or layers 321, 323, and 325.

Figure 7:
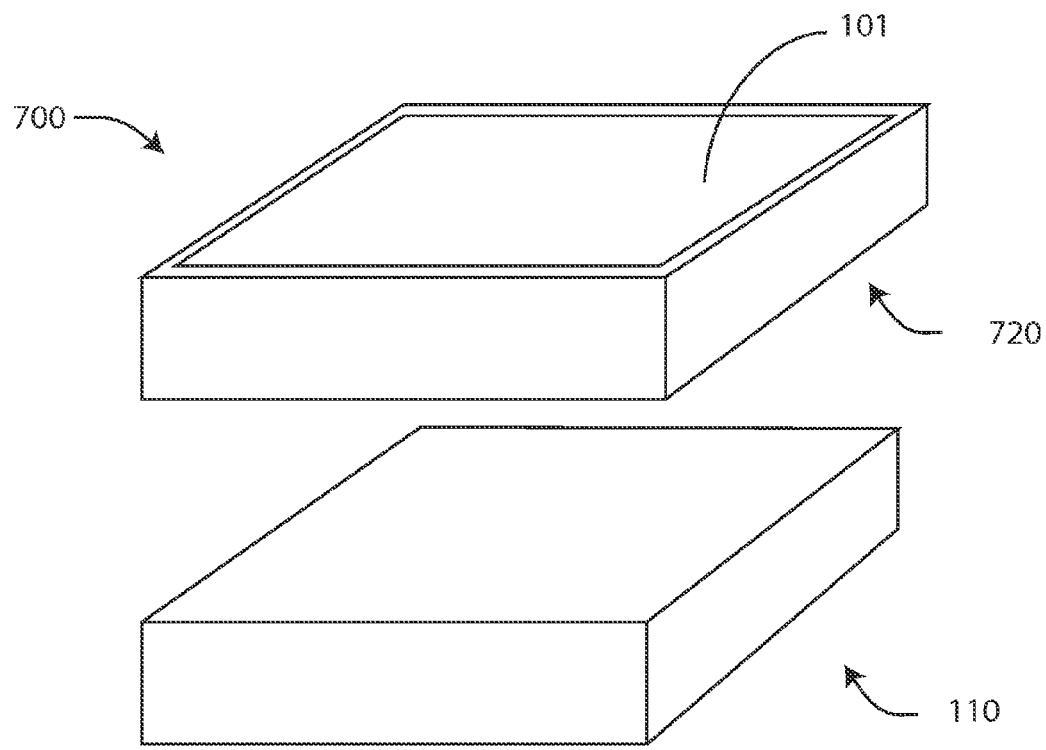
FIG. 7 is a perspective view of a fifth embodiment of a photovoltaic cell and cover showing the cell and cover separated from each other.
Figure 8:
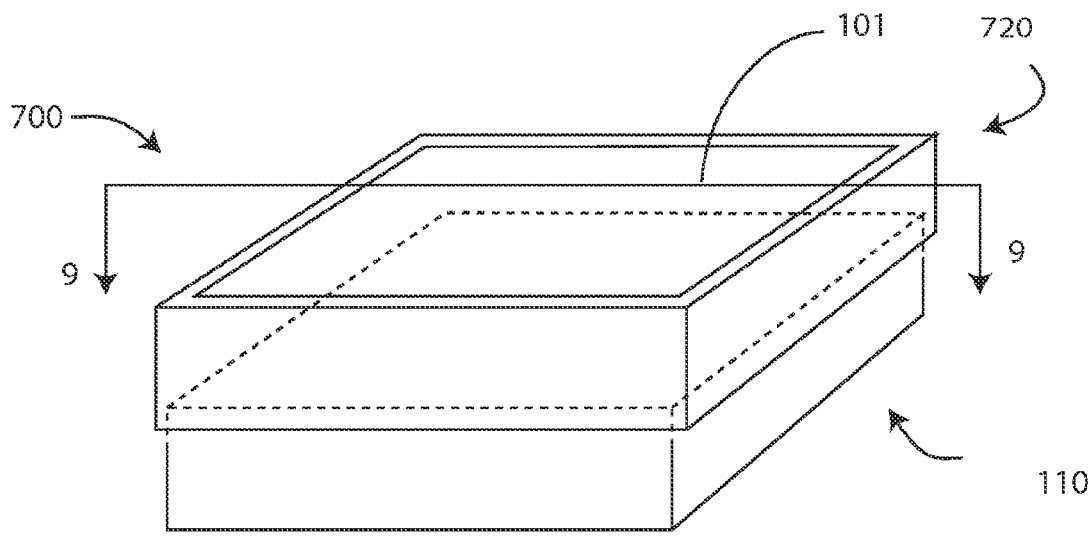
FIG. 8 is perspective view of the embodiment of FIG. 7 with the cover placed over the cell.

Alternative embodiments provides a cell cover 120, 320, 520, or 620 as an accessory for commercially available photovoltaic modules. Thus, for example, FIGS. 7 and 8 are perspective views of a fifth embodiment photovoltaic cell and cover 700 as including a cover 720 to fit over photovoltaic portion 110, where FIG. 7 shows the photovoltaic portion and cover separated from each other, and FIG. 8 shows the cover placed over the photovoltaic portion. Photovoltaic cell and cover 700 may be generally similar to photovoltaic cell and covers 100, 500, or 600 or cell covers 120 or 320, and include spacing elements as described with reference to those embodiments, except as further detailed. Where possible, similar elements are identified with identical reference numerals in the depiction of the embodiments of FIGS. 1A, 1B, 2, 3, 4, 5 and 6.

Figure 9:
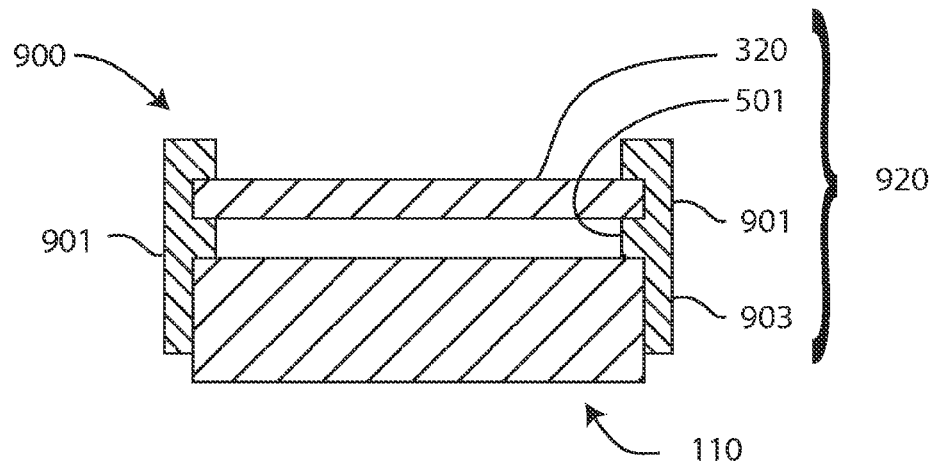
FIG. 9 is a first embodiment of sectional view 9-9 of FIG. 8.

FIG. 9 shows is a first embodiment of sectional view 9-9 of FIG. 8, as including a photovoltaic cell and cover 900, which includes a cover 920, that may be generally similar to photovoltaic cell and covers 500 and 700 and covers 520 and 720, except as further detailed. Where possible, similar elements are identified with identical reference numerals in the depiction of the embodiments of FIGS. 1-8.

Cover 900 that includes a housing 901 that incorporates spacing elements 501 and the material of cover 320. Housing 901 is a rigid housing formed, for example but not limited to, one or more pieces of a metal, plastic, or ceramic. Housing 901 also includes a lip 903 that may be sized to fit over a photovoltaic system. Alternatively, screws or other mechanical devices may be used to fix housing 901 or lip 903 to a photovoltaic system, such as photovoltaic portion 110.

Figure 10:
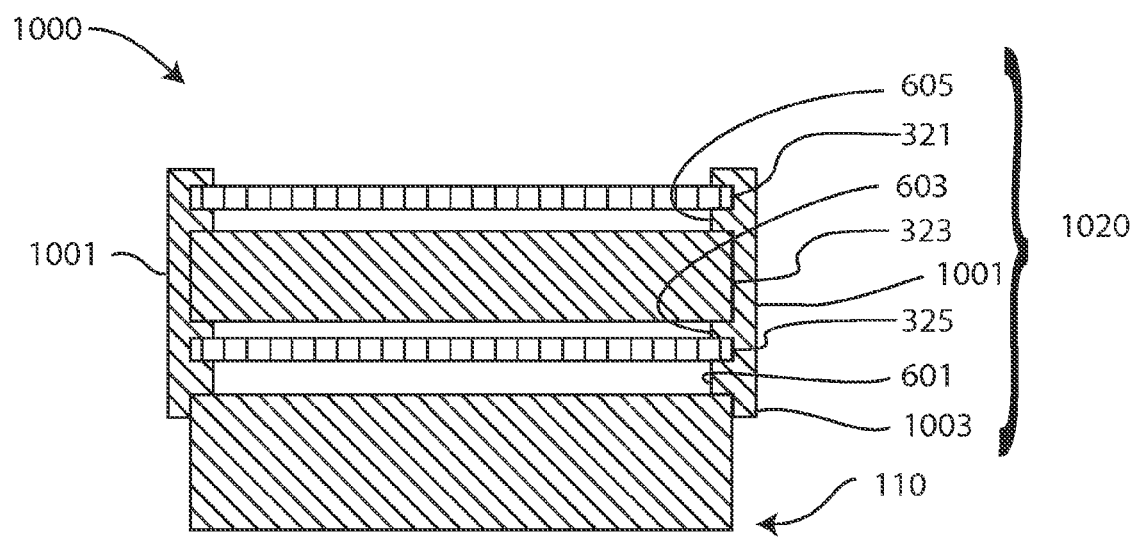
FIG. 10 is a second embodiment of sectional view 9-9 of FIG. 8.

FIG. 10 shows a second embodiment of sectional view 9-9 of FIG. 8, as including a photovoltaic cell and cover 1000, which includes a cover 1020, that may be generally similar to photovoltaic cell and covers 600 and 700 and covers 620 and 720, except as further detailed. Where possible, similar elements are identified with identical reference numerals in the depiction of the embodiments of FIGS. 1-8.

Cover 1020 includes a housing 1001 that incorporates spacing elements 601, 603, and 605, and layers 321, 323, and 325. Housing 1001 is a rigid housing formed, for example but not limited to, one or more pieces of a metal, plastic, or ceramic. Housing 1001 also includes a lip 1003 that may be sized to fit over a photovoltaic system. Alternatively, screws or other mechanical devices may be used to fix housing 1001 or lip 1003 to a photovoltaic system, such as photovoltaic portion 110.

Alternatively in the embodiments of FIGS. 7-10 there may be no spacing elements to prevent optical materials from contacting photovoltaic portion 110. Thus, for example, spacing element 501 or 601 is optional.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

I claim:

1. A photovoltaic cell for converting incident radiative flux into electricity, comprising:
   a photovoltaic portion having band gap wavelength; and
   a cell cover substantially covering a light-receiving surface of said photovoltaic portion, where said cell cover includes
      a first layer including a reflective filter and adapted to receive said incident radiative flux,
      a second layer facing said first layer and including a fluorescent material having pump wavelengths and emission wavelengths, and
      a third layer between said second layer and said photovoltaic portion, and including a reflective filter,
      wherein said first layer has a transmissivity greater than or equal to 95% at said pump wavelength and a reflectivity greater than or equal to 95% at said emission wavelength.

2. The photovoltaic cell of claim 1, where said first layer and third layer are interference filters.

3. The photovoltaic cell of claim 1, where said first layer and third layer are deposited on opposing sides of said second layer.

4. The photovoltaic cell of claim 1, where said second layer includes neodymium.

5. The photovoltaic cell of claim 1, where said second layer is a neodymium glass.

6. The photovoltaic cell of claim 4, where said third layer reflects light at said pump wavelength.

7. The photovoltaic cell of claim 1, where said emission wavelength is less than or equal to said band gap wavelength.

8. The photovoltaic cell of claim 7, where said emission wavelength is within 10% of said band gap wavelength.

9. The photovoltaic cell of claim 7, where said emission wavelength is within 5% of said band gap wavelength.

10. The photovoltaic cell of claim 1, where said photovoltaic portion is approximately parallel to and spaced apart from said first layer.

11. The photovoltaic cell of claim 1, where said first layer is approximately parallel to and spaced apart from said second layer.

12. The photovoltaic cell of claim 1, where said second layer is approximately parallel to and spaced apart from said third layer.

13. A cover for receiving an incident radiative flux for a photovoltaic device, where said photovoltaic device has a band gap wavelength and a light-receiving surface for converting incident radiative flux into electricity, said cover comprising:
    a first layer including a reflective filter and adapted to receive said incident radiative flux;
    a second layer facing said first layer and including a fluorescent material having pump wavelengths and emission wavelengths; and
    a third layer between said second layer and said photovoltaic device, and including a reflective filter,
    wherein said first layer has a transmissivity greater than or equal to 95% at said pump wavelength and a reflectivity greater than or equal to 95% at said emission wavelength.

14. The cover of claim 1, said cover further comprising:
    a light-receiving surface substantially parallel to and having approximately the same area as said a light-receiving surface of said photovoltaic portion.

15. The cover of claim 13, wherein said first layer and third layer are interference filters.

16. The cover of claim 13, wherein said first layer and third layer are deposited on opposing sides of said second layer.

17. The cover of claim 13, wherein said second layer includes neodymium.

18. The cover of claim 13, wherein said second layer is a neodymium glass.

19. The cover of claim 17, wherein said third layer reflects light at said pump wavelength.

20. The cover of claim 13, wherein said emission wavelength is less than or equal to said band gap wavelength.

21. The cover of claim 20, wherein said emission wavelength is within 10% of said band gap wavelength.

22. The cover of claim 20, wherein said emission wavelength is within 5% of said band gap wavelength.

23. The cover of claim 13, where said photovoltaic device is approximately parallel to and spaced apart from said first layer.

24. The cover of claim 13, where said first layer is approximately parallel to and spaced apart from said second layer.

25. The cover of claim 13, where said second layer is approximately parallel to and spaced apart from said third layer.

26. The photovoltaic cell of claim 1, where said cell cover has a light-receiving surface substantially parallel to and having approximately the same area as said light-receiving surface of said photovoltaic portion.

* * * * *